United States Patent
Lin et al.

(10) Patent No.: US 7,192,789 B2
(45) Date of Patent: Mar. 20, 2007

(54) METHOD FOR MONITORING AN ION IMPLANTER

(75) Inventors: Chun Te Lin, Hsinchu (TW); Chih Sheng Yang, Hsinchu (TW); Hong Zhi Lee, Hsinchu (TW); Ta-Te Chen, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/942,381

(22) Filed: Sep. 15, 2004

(65) Prior Publication Data

US 2005/0142672 A1 Jun. 30, 2005

(30) Foreign Application Priority Data

Dec. 26, 2003 (TW) .............................. 92137173 A

(51) Int. Cl.
*H01L 21/00* (2006.01)
*H01L 21/425* (2006.01)
*G01R 31/26* (2006.01)

(52) U.S. Cl. .............................. 438/4; 438/10; 438/17; 438/530; 257/E21.033; 257/E21.337

(58) Field of Classification Search ................ 438/433, 438/514, 530, 4, 5, 10, 14, 17; 257/E21.337
See application file for complete search history.

(56) References Cited

U.S. PATENT DOCUMENTS

| 4,553,098 | A | * | 11/1985 | Yoh et al. .................... 324/433 |
| 5,125,740 | A | * | 6/1992 | Sato et al. ................... 356/128 |
| 5,244,820 | A | * | 9/1993 | Kamata et al. ............. 438/514 |
| 5,442,297 | A | * | 8/1995 | Verkuil ........................ 324/702 |
| 5,451,529 | A | | 9/1995 | Hsu et al. |
| 5,476,006 | A | * | 12/1995 | Fujii et al. ..................... 73/105 |
| 5,861,632 | A | * | 1/1999 | Rohner .................. 250/492.21 |
| 6,128,084 | A | * | 10/2000 | Nanbu et al. ............... 356/369 |
| 6,136,613 | A | * | 10/2000 | Lin et al. ........................ 438/4 |
| 6,342,431 | B2 | * | 1/2002 | Houlihan et al. ........... 438/433 |
| 6,462,817 | B1 | * | 10/2002 | Strocchia-Rivera ......... 356/369 |

FOREIGN PATENT DOCUMENTS

JP 01230232 * 9/1989

* cited by examiner

*Primary Examiner*—Michael Lebentritt
*Assistant Examiner*—Ron Pompey
(74) *Attorney, Agent, or Firm*—Townsend and Townsend and Crew LLP

(57) ABSTRACT

A method for monitoring an ion implanter is disclosed. In one embodiment, the method comprises providing a wafer, forming a barrier layer on the surface of the wafer wherein the barrier layer has a substantial blocking effect on ion implantation, performing an ion implantation process to the wafer, performing a thermal treatment process, removing the barrier layer, and measuring a physical property of the wafer. The measured physical property of the wafer can be used to ascertain the status of the ion implanter. For instance, the measured physical property can be used to determine whether the ion implanter has problems when the energy or concentration of the implanted ions is changed.

21 Claims, 4 Drawing Sheets

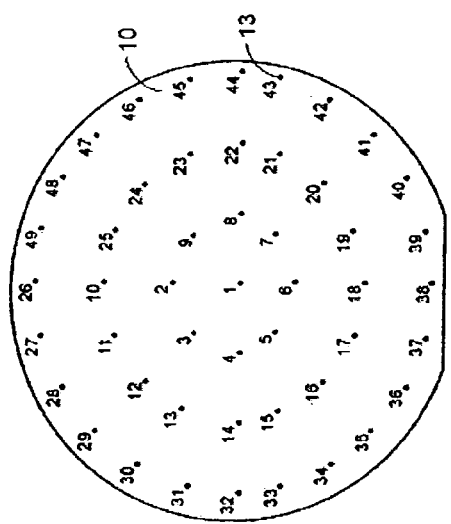

| (Energy variation) | | | | |
|---|---|---|---|---|
| | Without barrier layer | 1000A oxide layer | Without barrier layer | 1000A oxide layer |
| Condition | Resistance | Resistance | Deviation | Deviation |
| 31P/60KeV/1.0E14 | 525.6 | 2965 | | |
| 31P/64KeV/1.0E14 | 513.3 | 2234 | 2.3% | 24.7% |
| 31P/68KeV/1.0E14 | 503.5 | 1828 | 1.9% | 18.2% |
| 31P/72KeV/1.0E14 | 493.4 | 1534 | 2.0% | 16.1% |
| 31P/76KeV/1.0E14 | 485.1 | 1318 | 1.7% | 14.1% |
| 31P/76KeV/1.0E14 | 478 | 1118 | 1.5% | 15.2% |

Fig. 3(a)

| (Dosage variation) | | | | |
|---|---|---|---|---|
| | Without barrier layer | 1000A oxide layer | Without barrier layer | 1000A oxide layer |
| Condition | Resistance | Resistance | Deviation | Deviation |
| 31P/60KeV/0.9E14 | 556.2 | 2707 | | |
| 31P/60KeV/1.0E14 | 521.8 | 2615 | 6.2% | 3.4% |
| 31P/60KeV/1.1E14 | 492.9 | 2386 | 5.5% | 8.8% |

Fig. 3(b)

METHOD FOR MONITORING AN ION IMPLANTER

CROSS-REFERENCES TO RELATED APPLICATIONS

This application claims priority from R.O.C. Patent Application No. 092137173, filed Dec. 26, 2003, the entire disclosure of which is incorporated herein by reference.

BACKGROUND OF THE INVENTION

The present invention relates to a method for monitoring, and more particularly to a method for monitoring an ion implanter.

In the semiconductor industry, the technique of ion implantation is broadly utilized to produce electronic devices. In the process of ion implantation, the doped atoms or molecules, as the form of charged ions, are accelerated to directly hit and enter a target with a specific energy level. Therefore, the depth profile of implanted ions in the target can be accurately controlled by the energy of implanted ions, and the dosage of implanted ions can be accurately controlled by the implantation time and the current of the ion beam. The use of ion implantation not only can accurately control the depth profile and dosage of the implanted ions but also produce more well-distributed and purer dopants.

Nowadays, ions are implanted in a wafer by an ion implanter in the semiconductor doping process. Since the quality of a semiconductor device will be affected by the quantity and distribution of ions doped in the wafer, how to judge whether an ion implanter has problems or not in time when the energy or concentration of the implanted ions is changed is an important task for the semiconductor doping process.

Although there is a relative control device for the operation condition of the ion implanter, it is controlled by electronic signals and cannot reflect the real situation in the operation process.

Therefore, how to develop a method for monitoring an ion implanter, which can overcome the above shortcomings of the prior art and judge whether the ion implanter has problems or not, is an urgent problem needed to be solved now.

BRIEF SUMMARY OF THE INVENTION

Embodiments of the present invention provide a method for monitoring an ion implanter, which can overcome the problem that the prior art cannot monitor the real situation in the operation process, and quickly judge if there is any change of the energy of the implanted ions or not.

As known by one skilled in the ion implantation art, implanted ions will be distributed to a specific depth after the ions are implanted in a substrate. For example, the concentration of the ions will gradually increase to a specific value from the surface of the substrate and then gradually decrease after a specific depth.

If there is a barrier layer on the top of the substrate, it can substantially trap some implanted ions, and thus the state of the ions in the substrate will be different.

The different state of the ions is able to reflect the physical property change of the substrate, e.g., resistance, optical property, acoustic property, surface property of the substrate and the like.

If the energy of the implanted ions is changed, the physical property will deviate from the normal value.

The above features and advantages of the present invention will become more readily apparent to those ordinarily skilled in the art after reviewing the following detailed description and accompanying drawings.

BRIEF DESCRIPTION OF THE DRAWINGS

FIGS. 2(a) and (b) show the distribution of the measuring points on the surface of the wafer according to an embodiment of the present invention;

FIG. 3(a) is a table showing the resistance variation upon different energy of ion implantation according to the method of an embodiment of the present invention; and FIG. 3(b) is a table showing the resistance variation upon different dosage of ion implantation according to the method of an embodiment of the present invention.

DETAILED DESCRIPTION OF THE INVENTION

Figure 1A:
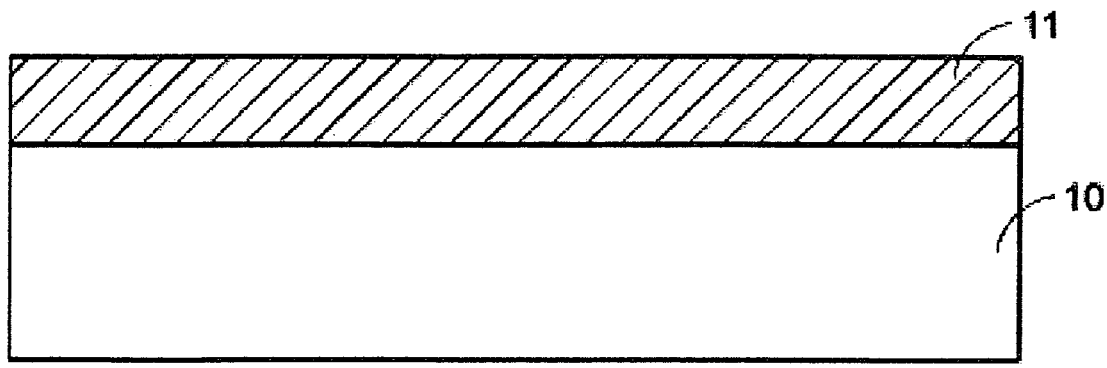
FIGS. 1(a)–(d) show cross-sectional views illustrating the method for monitoring an ion implanter according to an embodiment of the present invention.
Figure 1B:
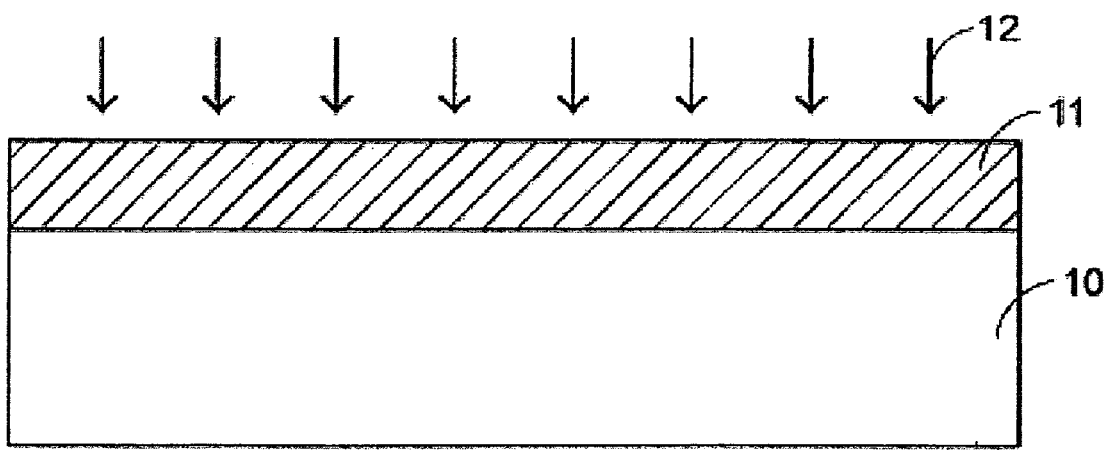
Figure 1C:
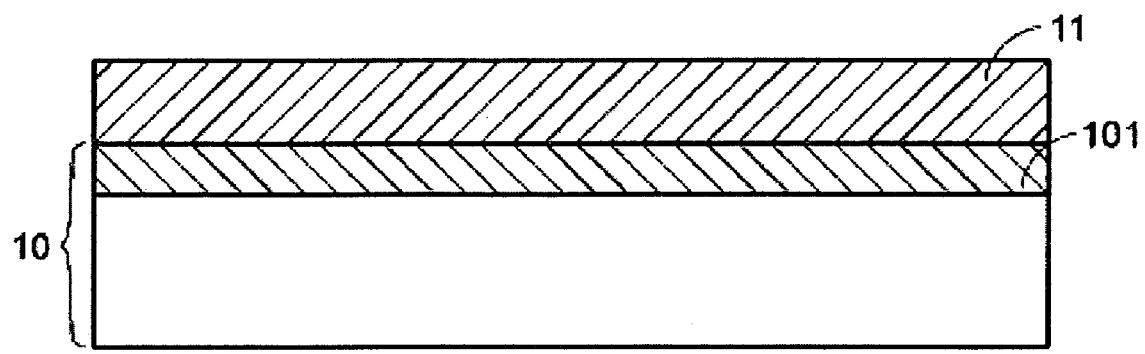

FIGS. 1(a)–(d) show cross-sectional views illustrating the method for monitoring an ion implanter according to an embodiment of the present invention. As shown in FIG. 1(a), first a wafer 10 is provided, and a barrier layer 11 is formed on the surface of the wafer 10. The barrier layer 11 is composed of a material that has a substantial blocking effect on ion implantation. The thickness of the barrier layer is determined by the energy or concentration of the implanted ions. With the specific thickness, the property of the to-be-measured region of the wafer has a comparison meaning (such as on statistics or quality control) for measuring and judging whether it deviates from the normal value after the process of ion implantation. The barrier layer 11 can be an oxide layer formed by thermal oxidation, or a silicon nitride layer or a polysilicon layer formed by chemical vapor deposition. When the barrier layer 11 is an oxide layer, the thickness of the barrier layer 11 is about 1000–2000 Å, and the barrier layer 11 is substantially silicon dioxide. Then, an ion implantation process 12 is performed on the wafer 10 and the barrier layer 11 by an ion implanter (not shown), as shown in FIG. 1(b). The majority of the ions are blocked by the barrier layer 11 and retained in the barrier layer 11, and only a portion of ions can penetrate the barrier layer 11 and implant in the surface of the wafer 10 to form a conductive (e.g., electrically conductive) region 101 on the surface of the wafer 10, as shown in FIG. 1(c). Subsequently, a thermal treatment process, e.g., rapid thermal annealing (RTA), is performed on the wafer 10 and the barrier layer 11 to rearrange the silicon lattice of the wafer 10 to an acceptable degree (e.g., the rearrangement degree of silicon lattice derived from the operation with RTA parameters for production).

After the process of ion implantation, the property of the wafer can be directly observed by a thermal wave method, which can be performed on Therma-Probe XPR Series provided by Therma-Wave Inc. in U.S.A. (1250 Reliance Way, Fremont, Calif. 94539, U.S.A.; Tel: 510-668-2200, Fax: 510-656-3863).

Figure 1D:
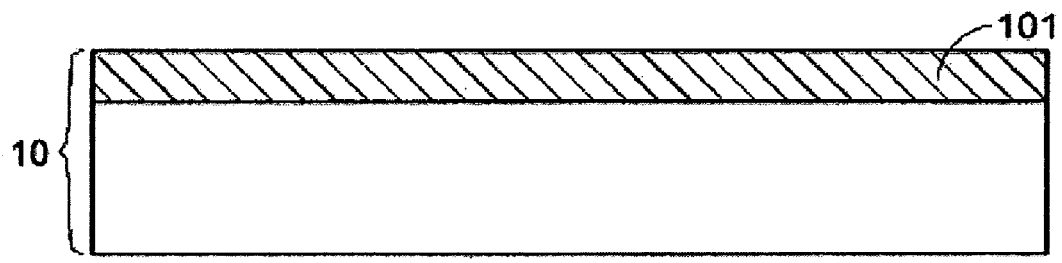

Afterward, as shown in FIG. 1(d), the barrier layer 11 is removed from the surface of the wafer 10. If the barrier layer 11 is an oxide layer, it can be removed by wet etching with an etching solution containing hydrofluoric acid. If the barrier layer 11 is a silicon nitride layer, it can be removed by wet etching with a solution containing phosphoric acid.

Finally, the physical property of the conductive region 101 of the wafer 10 can be measured to judge whether the implantation energy of the ion implanter is greatly changed or abnormal by the change of the measured physical property.

In some embodiments, the measured physical property can be resistance (Rs), surface property of wafer, optical property of wafer and the like. The methods and instruments for measuring these physical properties are described as follows.

(1) Measurement of resistance: The resistance of the conductive region 101 on the surface of the wafer 10 can be measured by a sheet resistivity meter via a four-point probe method. The measuring method is to select plural measuring points 13, such as 49 points shown in FIG. 2(*a*) or 81 points shown in FIG. 2(*b*), and then measure the resistance of each measuring point 13 and calculate the average thereof.

(2) Measurement of surface properties of wafer: Since ion implantation has influences on the surface roughness and stress of the wafer 10, the ion implanter can be monitored by measuring the property change of the surface roughness and stress of the wafer 10 after ion implantation. The surface roughness can be measured by scanning probe techniques such as Scanning Tunneling Microscopy (STM), Atomic Force Microscopy (AFM) and Scanning Near-Field Optical Microscopy (SNOM), which have been relatively new microscopy techniques. The feature thereof is that an extremely tiny probe or a micro-sensor capable of measuring some specific physical properties is used to scan the wafer at a very short distance from the wafer and simultaneously obtain various information from the surface of the wafer, including, for instance, surface structure, topology, electrical property, magnetic property, optical property and surface potential. Additionally, the surface stress can be measured by an analytical electron microscope (AEM) performing convergent beam electron diffraction (CBED) to carry out symmetry examination for the wafer surface and derive relative information.

When the barrier layer is a polysilicon layer, since the resistance of the polysilicon layer has been changed by ion implantation, the polysilicon layer need not be removed and the resistance and the optical property or other physical properties of the polysilicon layer can be measured.

If the barrier layer is a polysilicon layer, the property of the wafer can be observed with a thermal wave method directly after ion implantation. The thermal wave method can be performed on Therma-Probe XPR Series provided by Therma-Wave Inc. of U.S.A. (1250 Reliance Way, Fremont, Calif. 94539, U.S.A.; Tel: 510-668-2200, Fax: 510-656-3863).

FIGS. 3(*a*) and (*b*) show tables of resistance of the sample derived from the monitoring method according to an embodiment of the present invention, and it is performed on an ion implanter under a normal state. The resistance is measured with 49 measuring points as shown in FIG. 2(*a*). The condition of ion implantation is to change the energy of implanted ions, as shown in the first column of the table in FIG. 3(*a*). For example, when the condition of ion implantation is 31P/60 KeV/1.0E 14, it means that the implanted atom is phosphor with an atomic weight of 31, the energy of implantation is 60 KeV, and the dosage of implantation is 1.0E14. The second and fourth columns show the resistance and deviation derived from the wafer without a barrier layer after ion implantation. The third and fifth columns show the resistance and deviation derived from the wafer covered with a 1000 Å oxide layer. Comparing the second and third columns, when the energy of implantation is changed, the resistance variation of the wafer covered with a 1000 Å oxide layer is far greater than that of the wafer without a barrier layer. Therefore, according to the method provided by the present embodiment, whether the ion implanter is normal or not can be judged on the basis of whether the resistance of the sample deviates from the normal value when the energy of implantation is changed somewhat.

The normal values of other physical properties, e.g., property derived from the thermal wave method, optical property, surface property and so on, can be set in the same way.

Referring to FIG. 3(*b*), the condition of ion implantation is to change the dosage of the implanted ions. The method for measuring resistance and the condition expression are identical to those of FIG. 3(*a*). The meaning of each column is also identical to that of FIG. 3(*a*). Comparing the second and third columns, when the dosage of implantation is changed, the resistance variation of the wafer covered with a 1000 Å oxide layer is far greater than that of the wafer without a barrier layer. Therefore, according to the method of the present embodiment, whether the ion implanter is normal or not can be judged on the basis of whether the resistance of the sample deviates from the normal value when the dosage of implantation is changed somewhat.

The method for monitoring an ion implanter provided by the present embodiment is to set constant parameters for the ion implanter first when it is under a normal state, and produce several samples according to the flowchart illustrated in FIG. 1 to obtain a normal value (by the method of statistics or quality control). After the normal value is obtained, it can be used as a control standard. During regular operation, the measured value is derived from the sample produced according to the flowchart illustrated in FIG. 1. When the measured value deviates from the above-mentioned normal value to an unacceptable degree for quality control, the ion implanter will be judged as abnormal and can be further checked afterward.

When the barrier layer is a polysilicon layer and is not removed, several samples are also produced to obtain a normal value (by the method of statistics or quality control). Of course, during regular operations, the barrier layer is not removed in the method for monitoring an ion implanter.

When the barrier layer is a polysilicon layer, the thermal treatment process in FIG. 1 need not be performed.

The thickness of the barrier layer of the present invention is not limited to the above-mentioned thickness; it depends on the ions and the energy of ion implantation, so it can be dynamically adjusted according to the energy of ion implantation needed in various semiconductor processes. Moreover, the ion to be implanted in the ion implantation process 12 can be boron, phosphorous, arsenic, antimony, or other elements of group 3 or 5.

In addition, the types of instruments used in each process of the present invention are not limited. In some embodiments, the ion implanter can be NH-20SR provided by Ion Equipment Co., Ltd. in Tokyo, Japan. The annealing process can be performed on AG8100, an RTA instrument provided by ALLWin21 Corp. Additionally, the deposition of the barrier layer can be performed on TEL IW-6D, a deposition instrument provided by OLM Enterprises.

In conclusion, the method for monitoring an ion implanter according to an embodiment of the present invention employs a barrier layer having a substantial blocking effect on ion implantation, and thus makes the wafer more sensitive to the penetration rate of implanted ions. Therefore, when the energy of ion implantation is changed, it can greatly increase the resistance variation, which is employed to judge whether the energy of ion implantation is normal or not.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for monitoring an ion implanter, comprising:
   providing a wafer;
   forming a barrier layer on the surface of said wafer, wherein said barrier layer has a substantial blocking effect on ion implantation that causes a majority of ions to be retained in said barrier layer and only a portion of ions to implant on the surface of said wafer;
   performing an ion implantation process on said wafer using an ion implanter, a portion of ions penetrating the barrier layer to form a conductive region on the surface of said wafer;
   performing a thermal treatment process;
   removing said barrier layer; and
   measuring a physical property of the conductive region of said wafer after performing the ion implantation process to form the conductive region, performing the thermal treatment process, and removing the barrier layer, wherein said measured physical property of the conductive region of said wafer is indicative of a status of said ion implanter.

2. The method according to claim 1 wherein said barrier layer is an oxide layer.

3. The method according to claim 2 wherein said barrier layer is formed by thermal oxidation.

4. The method according to claim 2 wherein said barrier layer is removed by etching.

5. The method according to claim 4 wherein said etching is wet etching.

6. The method according to claim 5 wherein a hydrofluoric acid solution is used for said wet etching.

7. The method according to claim 1 wherein said barrier layer is a silicon nitride layer.

8. The method according to claim 7 wherein said barrier layer is formed by chemical vapor deposition.

9. The method according to claim 7 wherein said barrier layer is removed by etching.

10. The method according to claim 9 wherein said etching is wet etching.

11. The method according to claim 10 wherein a phosphoric acid solution is used for said wet etching.

12. The method according to claim 1 wherein said barrier layer is a polysilicon layer.

13. The method according to claim 1 wherein the thickness of said barrier layer is determined based on ions and energy of said ion implantation.

14. The method according to claim 1 wherein said thermal treatment is annealing.

15. The method according to claim 1 wherein said physical property is selected from the group consisting of resistance, surface property and optical property.

16. The method according to claim 1 wherein ions for said ion implantation are selected from the group consisting of boron, phosphorous, arsenic, antimony, and other elements of group 3 and group 5.

17. A method for monitoring an ion implanter, comprising:
    providing a wafer;
    forming a barrier layer on a surface of said wafer, wherein said barrier layer has a substantial blocking effect on ion implantation that causes a majority of ions to be retained in said barrier layer and only a portion of ions to implant on the surface of said wafer;
    performing an ion implantation process on said wafer using an ion implanter, a portion of ions penetrating the barrier layer to form a conductive region on the surface of said wafer; and
    measuring a physical property of the conductive region of said wafer after performing the ion implantation process to form the conductive region, wherein said measured physical property of the conductive region of said wafer is indicative of a status of said ion implanter.

18. The method according to claim 17 wherein said barrier layer is a polysilicon layer.

19. The method according to claim 17 wherein said physical property is measured by a thermal wave method.

20. The method according to claim 1 further comprising evaluating whether implantation energy of said ion implanter has changed by a change in said measured physical property.

21. The method according to claim 17 wherein a thermal treatment process is not performed on said wafer before or after said barrier layer is formed.

* * * * *